United States Patent
Toting et al.

(10) Patent No.: US 10,098,237 B2
(45) Date of Patent: Oct. 9, 2018

(54) PRINTED CIRCUITS WITH LASER ABLATED CONFORMAL COATING OPENINGS

(71) Applicant: Apple Inc., Cupertino, CA (US)

(72) Inventors: Ferdinand S. Toting, Daly City, CA (US); Arpit K. Akkinepalli, San Francisco, CA (US); Goran S. Diminich, Cupertino, CA (US); Xiaoyi Zhou, San Jose, CA (US)

(73) Assignee: Apple Inc., Cupertino, CA (US)

( * ) Notice: Subject to any disclaimer, the term of this patent is extended or adjusted under 35 U.S.C. 154(b) by 158 days.

(21) Appl. No.: 15/056,291

(22) Filed: Feb. 29, 2016

(65) Prior Publication Data

US 2016/0262261 A1    Sep. 8, 2016

Related U.S. Application Data

(60) Provisional application No. 62/127,233, filed on Mar. 2, 2015.

(51) Int. Cl.
| | |
|---|---|
| *H05K 7/10* | (2006.01) |
| *H05K 7/12* | (2006.01) |
| *H05K 3/28* | (2006.01) |
| *H05K 3/00* | (2006.01) |

(52) U.S. Cl.
CPC ......... *H05K 3/288* (2013.01); *H05K 3/0026* (2013.01); *H05K 3/284* (2013.01); *H05K 3/285* (2013.01); *H05K 2201/015* (2013.01); *H05K 2201/0162* (2013.01); *H05K 2203/107* (2013.01)

(58) Field of Classification Search
USPC .................................................. 361/767, 808
See application file for complete search history.

(56) References Cited

U.S. PATENT DOCUMENTS

| | | | |
|---|---|---|---|
| 6,838,372 B2 | 1/2005 | Gilleo | |
| 7,752,751 B2 | 7/2010 | Kapusta et al. | |
| 8,493,749 B2 | 7/2013 | Myers et al. | |
| 8,546,194 B2 | 10/2013 | Choi et al. | |
| 2011/0085316 A1* | 4/2011 | Myers ................ | H05K 3/284 361/818 |
| 2012/0213470 A1* | 8/2012 | Matsuoka ........... | G02B 6/4249 385/14 |
| 2013/0279192 A1* | 10/2013 | Chang ................. | G02B 6/005 362/607 |
| 2016/0008923 A1 | 1/2016 | Astle et al. | |

* cited by examiner

*Primary Examiner* — Andargie M Aychillhum
(74) *Attorney, Agent, or Firm* — Treyz Law Group, P.C.; G. Victor Treyz; David K. Cole

(57) ABSTRACT

Electrical components may be mounted on a printed circuit or other substrate. The electrical components may be covered with a conformal coating containing a wavelength-tuned-light-absorption-enhancement additive. The additive may be a dye or other additive that creates a light absorption peak at a given wavelength. To form openings in the conformal coating in alignment with the electrical components without damaging the components, a laser ablation tool may apply laser light at the given wavelength to the conformal coating. Openings may also be formed by placing tape over the components before the con form at coating is applied. The tape may have a color with a light absorption peak at the given wavelength to facilitate the formation of openings without damaging sensitive components.

20 Claims, 5 Drawing Sheets

PRINTED CIRCUITS WITH LASER ABLATED CONFORMAL COATING OPENINGS

This application claims the benefit of provisional patent application No. 62/127,233, filed Mar. 2, 2015, which is hereby incorporated by reference herein in its entirety.

FIELD

This relates to electronic components such as components mounted on printed circuits and, more particularly, to forming openings in printed circuit conformal coatings.

BACKGROUND

Printed circuits are populated with integrated circuits, transducers, and other components. Printed circuits are mounted in the interior of electronic device housings. For example, printed circuits may be mounted in the interior of a cellular telephone or computer housing or other electronic device housing.

Some printed circuits are installed within the interiors of waterproof housings. In sealed environments such as these, the risk of exposing sensitive components to moisture is minimal. In many situations, however, printed circuits are installed within housings that provide a degree of environmental protection, but that are not completely waterproof. When installed in this type of device housing, there is a risk that sensitive components on a printed circuit may be exposed to moisture during normal device operation.

To reduce the sensitivity of components on a printed circuit to exposure to moisture, the components can he protected with a conformal coating. The conformal coating may cover the surface of a printed circuit and may prevent moisture damage by repelling liquids.

Conformal coatings may be deposited as blanket films. Effective sealing can be achieved by using conformal coating materials that cover all exposed surfaces of the components on a printed circuit board, even in scenarios in which the components have uneven heights and a variety of different shapes. The ability of conformal coating to coat complex surfaces without forming gaps allows the conformal coating to form a satisfactory environmental barrier, but can make it difficult to mask off portions of the printed circuit board. It can therefore be difficult to form openings in the conformal coating for test points, electrical connectors, and other components.

SUMMARY

Electrical components may be mounted on a printed circuit or other substrate. The electrical components may be covered with a conformal coating containing a wavelength-tuned-light-absorption-enhancement additive. The additive may be a dye or other additive that creates a light absorption peak at a given wavelength in the absorption spectrum of the conformal coating. To form openings in the conformal coating in alignment with the electrical components without damaging the components, a laser ablation tool may apply laser light at the given wavelength to the conformal coating.

Openings may also be formed by placing tape over the components before the conformal coating is applied. The tape may have a color with a light absorption peak at the given wavelength to facilitate the formation of openings without damaging sensitive components.

DETAILED DESCRIPTION

Electronic devices may include components such as electrical components mounted on substrates such as printed circuits. An electronic device that includes one or more printed circuits may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

The substrate onto which the electrical components are mounted may be a rigid printed circuit board (e.g., a printed circuit formed from a rigid printed circuit board material such as fiberglass-filled epoxy), may be a flexible printed circuit formed from a flexible sheet of polyimide or layer of other flexible polymer, may be a rigid plastic support structures (e.g., molded or machined plastic), may be a dielectric such as glass, ceramic, sapphire, or other dielectric material, or may be any other suitable substrate. Illustrative scenarios in which electrical components are mounted on a printed circuit board may sometimes be described herein as an example. This is, however, merely illustrative. Any suitable substrate may be provided with electrical components, if desired.

The electrical components that are mounted on the substrate may include integrated circuits. For example, the electrical components may include storage devices such as nonvolatile memory (e.g., flash memory or other electrically-programmable-read-only-memory memory configured to form a solid state drive), volatile memory (e.g., static or dynamic random-access-memory), or other storage circuits. The electrical components may also include processing circuitry such as microprocessors, microcontrollers, digital signal processors, baseband processors, power management units, audio chips, application specific integrated circuits, etc. The electrical components may include buttons, touch pads, key pads, keyboards, microphones, speakers, tone generators, vibrators, cameras, light-emitting diodes and other status indicators, connectors for data ports, board-to-board connectors and other electrical connectors, sensors such as an ambient light sensor and other sensors (e.g., a capacitive proximity sensor, a light-based proximity sensor, a magnetic sensor, an accelerometer, a force sensor, a touch sensor, a temperature sensor, a pressure sensor, a compass, a microphone or other sound sensor, or other sensors), light-based components such as light-based proximity sensors, image sensors, and other electronic circuits and transducers.

Figure 1:
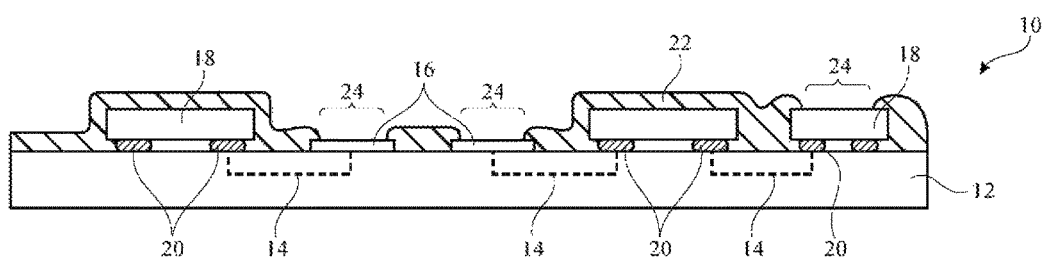
FIG. 1 is a cross-sectional side view of an illustrative printed circuit having electrical components covered by a conformal coating having openings in accordance with an embodiment.

A cross-sectional side view of an illustrative printed circuit that has been populated with electrical components is shown in FIG. 1. As shown in FIG. 1, printed circuit 10 may have one or more layers of dielectric material such as substrate 12 and one or more layers of metal traces 14 in the dielectric material. Solder 20 and other electrically conductive material (e.g., conductive adhesive, welded metal, etc.) may be used in mounting electrical components 18 to metal traces 14 in printed circuit 10.

To protect components 18 from the ambient environment (e.g., dust, moisture, chemicals, etc.), components 18 may be covered with a conformal coating such as conformal coating 22. Conformal coating 22 may be formed from polymer or other materials that help protect components 18. Examples of conformal coating materials include parylene, fluoropolymers, silicone, acrylic, epoxy, and polyurethane. These materials may be deposited in an uncured state (e.g., as a liquid) and cured (e.g., using heat, room temperature curing, ultraviolet light curing, etc.). Other deposition techniques and conformal coating materials may be used, if desired.

Openings such as openings 24 may be used to selectively expose components 18. For example, components 18 may include connectors and other components with metal contacts. To clear the contacts so that the connector can be attached to a mating connector, an opening such as one of openings 24 may be formed over the surface of the contact. Metal trace features such as contact pads 16 (e.g., test points for a test probe or bond pads) may also be cleared by forming openings 24. In some situations, components 18 may contain an optical component (e.g., a transparent optical structure). To ensure that the optical structure performs properly, an opening such as one of openings 24 may be formed through layer 22 to expose the optical structure. In general, any type of component 18 or structure on board 10 may be exposed by forming one or more aligned openings 24.

Figure 2:
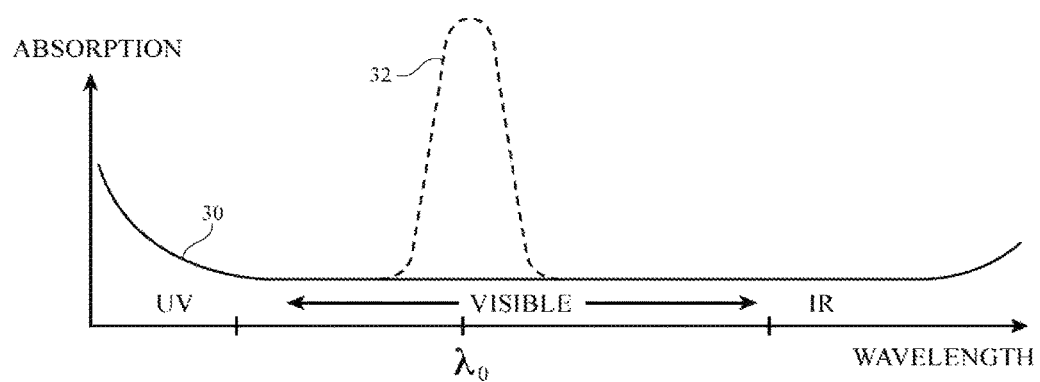
FIG. 2 is an illustrative absorption spectrum for a conformal coating with an absorption-enhancing dye or other additive in accordance with an embodiment.

Conformal coatings can penetrate between masking structures such as tape structures and removable dams. Accordingly, it may be desirable to use laser-based processing techniques (e.g., laser ablation techniques) to drill holes through layer 22. Conformal coating materials are often clear and exhibit minimal light absorption at laser wavelengths of interest. To enhance light absorption in conformal coating 22, a light-absorbing additive such as a dye or other additive may be incorporated in layer 22 (e.g., in the precursor material(s) used in forming layer 22). For example, if it is desired to enhance the absorption of layer 22 at green wavelengths, a green dye or other additive may be incorporated into coating 22 that enhances absorption of layer 22 at green wavelengths. An illustrative absorption spectrum for a conformal coating is shown in FIG. 2. In the graph of FIG. 2, solid line 30 corresponds to the absorption of conformal coating 22 without the wavelength-tuned-light-absorption-enhancement additive. When a dye or other additive with an absorption peak at wavelength λo is incorporated into coating 22, coating 22 will exhibit enhanced absorption 32. The enhanced absorption peak may be a wavelength in the visible light range or may be an infrared or ultraviolet wavelength.

Figure 3:
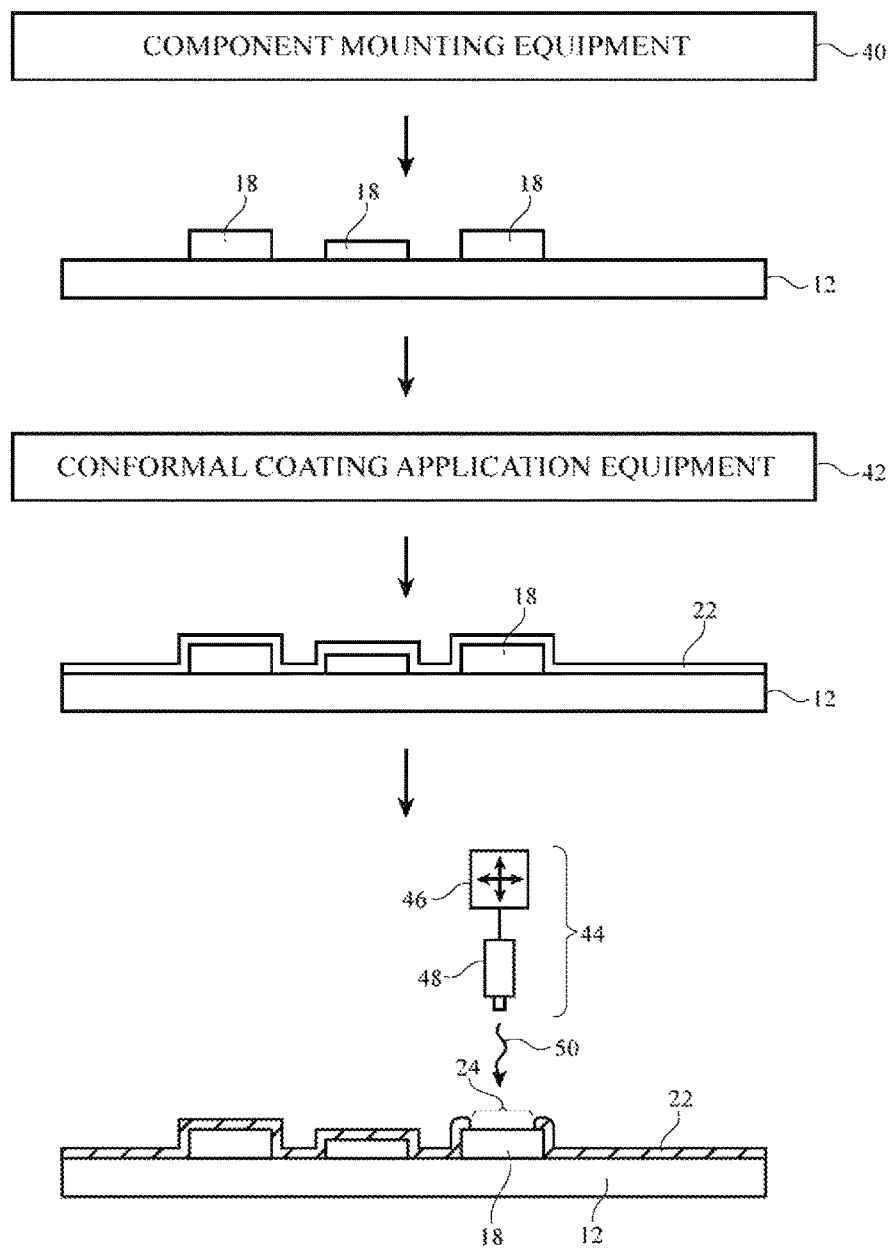
FIG. 3 is a diagram showing how a conformal coating may be deposited and patterned using laser patterning techniques in accordance with an embodiment.

Illustrative equipment and techniques for forming openings in coating 22 (i.e., a coating with a wavelength-tuned-light-absorption-enhancement additive) are shown in FIG. 3. initially, component mounting equipment 40 such as a pick-and-place tool or other soldering equipment may be used to mount components 18 on printed circuit substrate 12.

Conformal coating application equipment 42 may deposit conformal coating 22 over components 18 on the surface of printed circuit substrate 12. Conformal coating 22 may be, for example, a liquid and equipment 42 may deposit coating 22 using spraying, dipping, dripping, or needle application techniques. Deposition techniques such as physical vapor deposition and chemical vapor deposition and other techniques may also be used. Curing equipment (e.g., ultraviolet light curing equipment, heating equipment, etc.) may be used to facilitate curing of coating 22. The deposited layer may include a dye or other wavelength-tuned-light-absorption-enhancement additive.

Laser equipment (laser ablation tool) 44 may be used to form openings 24. Laser equipment 44 may include a computer-controlled positioner such as positioner 46 and a laser such as laser 48. Laser 48 may be a continuous wave (CW) laser or may be a pulsed layer. Laser 48 may produce light 50 at a visible wavelength, an ultraviolet wavelength, or an infrared wavelength. The wavelength of light 50 may match the absorption peak of the additive in coating 22 to enhance absorption of laser energy in layer 22 so that opening 24 may be ablated in layer 22. The enhanced absorption of light 50 helps prevent damage from light 50 to underlying components 18.

If desired, a tape layer may be provided with a dye or other material that enhances absorption of light 50. For example, a green tape layer may be used in forming openings 24 when laser light 50 is green. Equipment involved with this type of approach is shown in FIG. 4.

Figure 4:
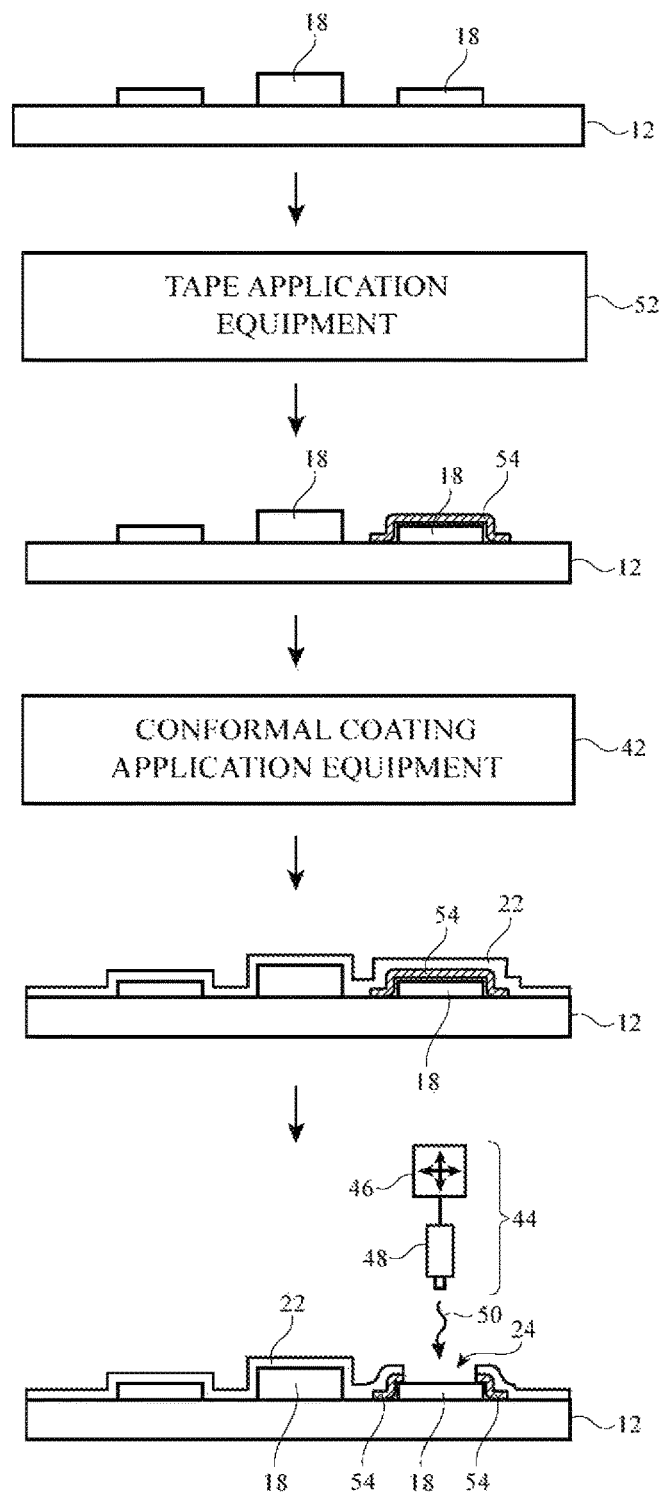
FIG. 4 is a diagram showing how tape may be used in facilitating laser patterning of conformal coating material in accordance with an embodiment.

As shown in FIG. 4, tape application equipment 52 may apply tape 54 over one or more components 18 on printed circuit substrate 12. Coating equipment 42 may then be used to apply conformal coating 22. Conformal coating 22 of FIG. 4 may include a wavelength-tuned-light-absorption-enhancement additive or may be transparent. When exposed to laser light 50, light 50 will be strongly absorbed in tape 54, facilitating the formation of opening 24 in layer 22 and tape 54 without damaging underlying components 18.

Figure 5:
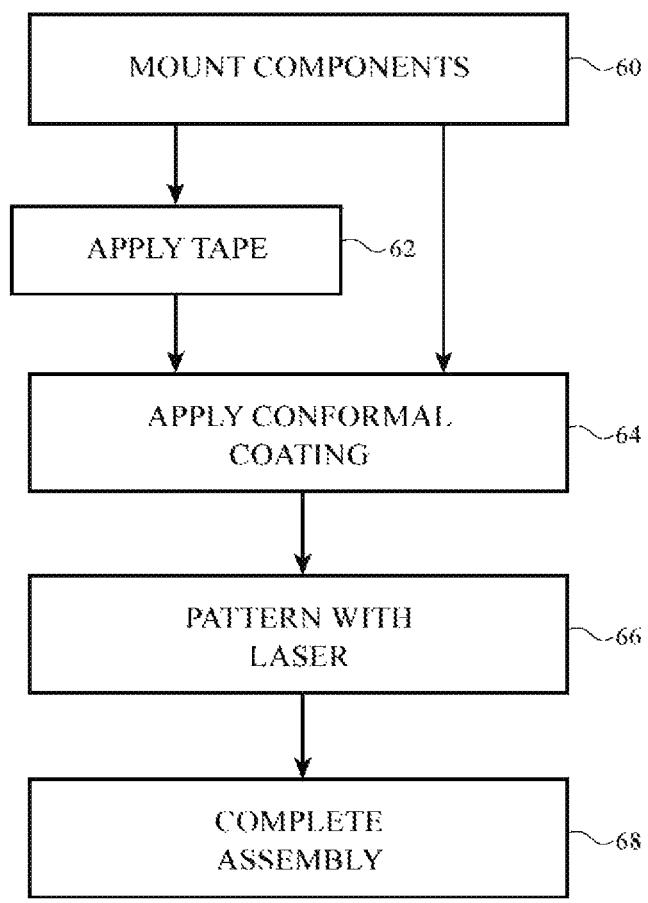
FIG. 5 is a flow chart of illustrative steps involved in depositing and patterning conformal coatings in accordance with an embodiment.

FIG. 5 is a flow chart of illustrative steps involved in forming openings 24 in conformal coating 22.

At step 60, equipment 40 may be used to mount electrical components on printed circuit 18. Printed circuit 18 may also contain metal traces that form test pads and other contacts for which it may be desired to form conformal coating openings 24.

If it is desired to incorporate tape 54 within the board, equipment 52 may be used to apply tape 54 (step 62).

At step 64, the printed circuit board (with or without the tape) is coated with conformal coating using tool 42. The conformal coating may include a wavelength-tuned-light-absorption-enhancement additive to enhance absorption of laser light 50. Laser light 50 may be used to ablate openings in layer 22 at step 66 using the additive in layer 22 and/or tape 54 to promote light absorption without damaging underlying structures.

After forming openings 24 by exposing layer 22 (and, if desired, underlying tape layer 54) to light 50, device assembly may be completed (step 68). For example, electrical contact may be formed with exposed metal structures, printed circuit board 10 may be mounted in an electronic device, etc.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
a substrate;
an electrical component mounted on the substrate; and
a conformal coating on the substrate with a wavelength-tuned-light-absorption-enhancement additive and a laser-ablated opening through the conformal coating, wherein the laser-ablated opening directly overlaps the electrical component and wherein the wavelength-tuned-light-absorption-enhancement additive has a light absorption peak at a wavelength chosen from the group of wavelengths consisting of: an ultraviolet light wavelength, a visible light wavelength, and an infrared light wavelength.

2. The apparatus defined in claim 1 wherein the conformal coating is selected from the group consisting of: acrylic, epoxy, silicone, polyurethane, parylene, and fluoropolymer.

3. The apparatus defined in claim 2 wherein the wavelength-tuned-light-absorption-enhancement additive has a light absorption peak at an ultraviolet light wavelength.

4. The apparatus defined in claim 2 wherein the wavelength-tuned-light-absorption-enhancement additive has a light absorption peak at a visible light wavelength.

5. The apparatus defined in claim 2 wherein the wavelength-tuned-light-absorption-enhancement additive has a light absorption peak at an infrared light wavelength.

6. The apparatus defined in claim 1 wherein the substrate comprises a printed circuit.

7. The apparatus defined in claim 6 wherein the wavelength-tuned-light-absorption-enhancement additive has a light absorption peak at a visible light wavelength.

8. The apparatus defined in claim 6 wherein the printed circuit has a contact pad and wherein the opening overlaps the contact pad.

9. The apparatus defined in claim 8 wherein the wavelength-tuned-light-absorption-enhancement additive has a light absorption peak at a visible light wavelength.

10. The apparatus defined in claim 1 wherein the wavelength-tuned-light-absorption-enhancement additive comprises a dye.

11. The apparatus defined in claim 10 wherein the dye has a light absorption peak at a visible wavelength or at an infrared wavelength.

12. The apparatus defined in claim 11 wherein the substrate comprises a printed circuit, wherein the printed circuit has a contact pad, wherein the electrical component is mounted on the printed circuit, and wherein the opening overlaps.

13. Apparatus, comprising:
a substrate;
a component mounted on the substrate;
tape that absorbs laser light at a laser wavelength that is provided by a laser ablation tool, wherein the tape has a color with a light absorption peak at the laser wavelength; and
a conformal coating on the substrate that overlaps at least some of the tape, wherein there is an opening through the conformal coating and the tape that exposes at least a portion of the component.

14. The apparatus defined in claim 13 wherein the conformal coating is selected from the group consisting of: acrylic, epoxy, silicone, polyurethane, parylene, and fluoropolymer.

15. The apparatus defined in claim 13 wherein the opening through the conformal coating directly overlaps the component.

16. The apparatus defined in claim 15 wherein the opening extends completely through the conformal coating and the tape.

17. The apparatus defined in claim 16 wherein the tape and the conformal coating overlap the printed circuit board and the component and wherein there is an additional opening that exposes at least a portion of the printed circuit board.

18. The apparatus defined in claim 13 wherein the apparatus comprises an interior and an exterior, wherein the tape and the conformal coating separate the interior from the exterior, and wherein the opening through the conformal coating and the tape exposes the component to the exterior of the apparatus.

19. Apparatus, comprising:
a substrate;
a conformal coating on the substrate with a wavelength-tuned-light-absorption-enhancement additive and a laser-ablated opening through the coating, wherein the wavelength-tuned-light-absorption-enhancement additive has a light absorption peak at a wavelength chosen from a group of wavelengths consisting of: an ultraviolet light wavelength, a visible light wavelength, and an infrared light wavelength.

20. The apparatus defined in claim 19 wherein the apparatus has an interior and an exterior and wherein the conformal coating separates the interior from the exterior, the apparatus further comprising:
an electrical component mounted on the substrate, wherein the laser-ablated opening through the conformal coating exposes the electrical component to the exterior of the apparatus.

* * * * *